United States Patent
Okano et al.

(10) Patent No.: US 7,049,826 B2
(45) Date of Patent: May 23, 2006

(54) INSPECTION DEVICE AND INSPECTION METHOD

(75) Inventors: Koji Okano, Fukuyama (JP); Shogo Ishioka, Hiroshima (JP)

(73) Assignee: OHT Inc., Fukayasu-Gun (JP)

( * ) Notice: Subject to any disclaimer, the term of this patent is extended or adjusted under 35 U.S.C. 154(b) by 0 days.

(21) Appl. No.: 10/129,097

(22) PCT Filed: Sep. 10, 2001

(86) PCT No.: PCT/JP01/07823

§ 371 (c)(1), (2), (4) Date: May 10, 2002

(87) PCT Pub. No.: WO02/23206

PCT Pub. Date: Mar. 21, 2002

(65) Prior Publication Data

US 2002/0180455 A1 Dec. 5, 2002

(30) Foreign Application Priority Data

Sep. 11, 2000 (JP) ............................. 2000-275503

(51) Int. Cl.
G01R 31/228 (2006.01)

(52) U.S. Cl. .................................... 324/530
(58) Field of Classification Search ............... 324/519, 324/520, 522, 523, 527, 530, 754, 765
See application file for complete search history.

(56) References Cited

U.S. PATENT DOCUMENTS 5,969,530 A * 10/1999 Yamashita ................. 324/537

FOREIGN PATENT DOCUMENTS

| JP | 64-57178 | 3/1989 |
| JP | 4-12468 | 1/1992 |
| JP | 11-153638 | 6/1999 |
| JP | 2000-74975 | 3/2000 |

* cited by examiner

Primary Examiner—Albert Decady
Assistant Examiner—James C. Kerveros
(74) Attorney, Agent, or Firm—Westerman, Hattori, Daniels & Adrian, LLP

(57) ABSTRACT

The present invention discloses a technique for inspecting a branched circuit wiring having branch portions branched halfway therefrom by using a less number of non-contact sensors. An inspection method for inspecting a branched circuit wiring having three or more ends, including the steps of: supplying an inspection signal to one end of the branched circuit wiring; disposing one or more non-contact sensors for detecting the inspection signal while being in non-contact with the branched circuit wiring over the remaining ends other than one end of the branched circuit wiring; and determining if any disconnection is caused in the branched circuit wiring, based on the inspection signal detected by the one or more non-contact sensors. The disposing step includes the step of arranging at least one of the one or more non-contact sensors to cover the remaining ends.

8 Claims, 5 Drawing Sheets

(a)

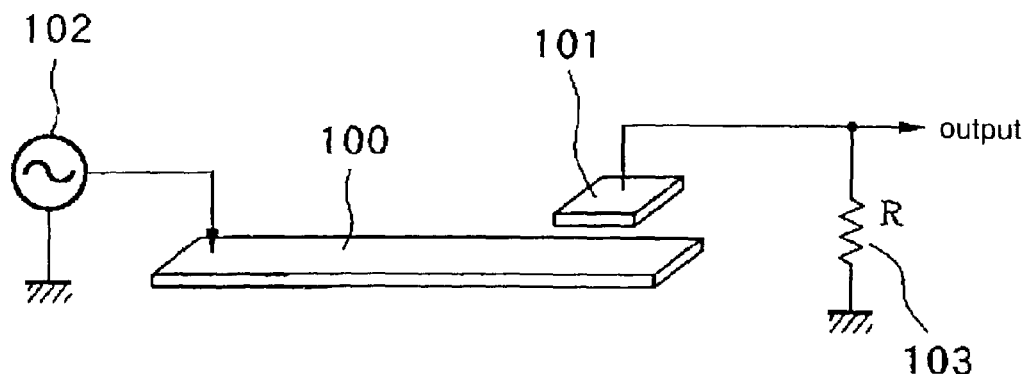
(a)
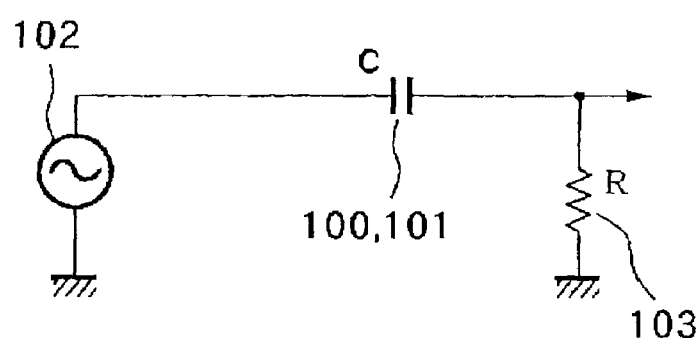
(b)
Fig. 1

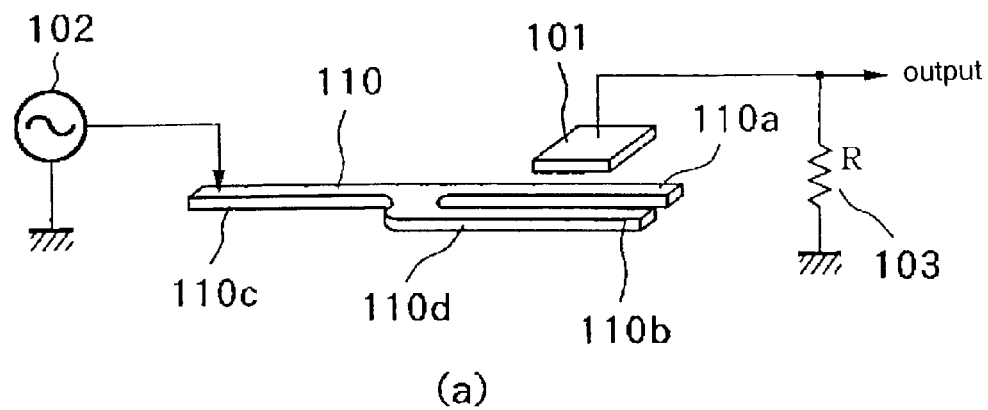
(a)
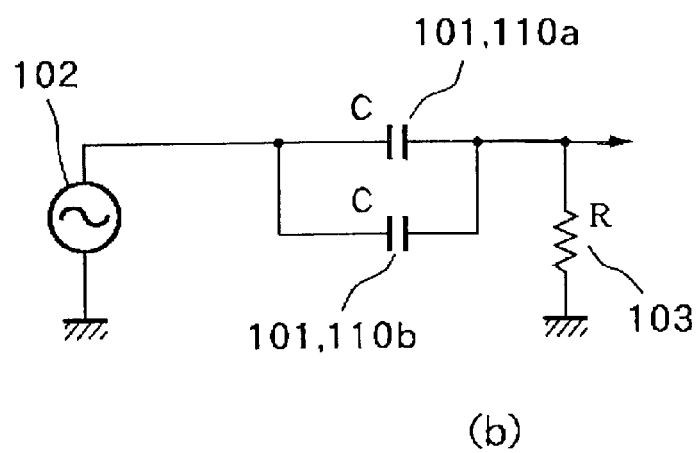
(b)
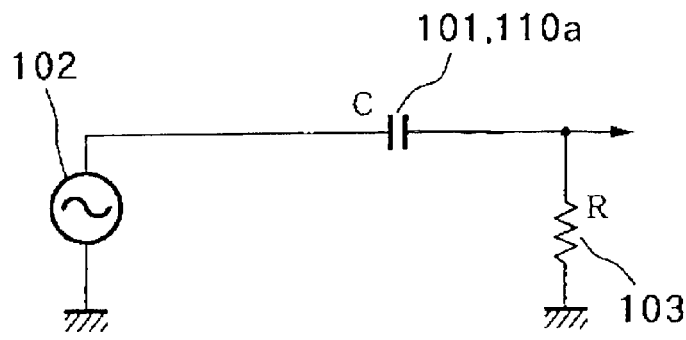
(c)
Fig. 2

INSPECTION DEVICE AND INSPECTION METHOD

TECHNICAL FIELD

The present invention relates to a technology for inspecting a circuit wiring.

BACKGROUND ART

For inspecting the presence of disconnection in a circuit wiring (conductive pattern) on a circuit board, a method is employed which comprises the steps of supplying an inspection signal to the circuit wiring, detecting the inspection signal at the end or the like of the circuit wiring, and analyzing the detected signal. In terms of techniques for detecting the inspection signal at the end or the like of the circuit wiring, there have been proposed a contact type using a probe in contact with the circuit wiring, and a non-contact type using a sensor in non-contact with the circuit wiring.

In the non-contact type inspection, a temporally varying inspection signal is supplied to the circuit wiring, and a resulting signal arising at the non-contact sensor through a capacitance interposed between the non-contact sensor and the circuit wiring is detected to inspect the presence of disconnection or the like in the circuit wiring. As for the non-contact sensor, various types of sensors, such as an electrode type composed of a conductive metal plate or the like, or a semiconductor device The non-contact type inspection is advantageous in that the circuit wiring is seldom damaged because the sensor is in non-contact with the circuit wiring, and such an inspection has wide applicability to fine-pitch circuit wirings.

One example of the non-contact type inspection is described, for example, in Japanese Patent Laid-Open Publication No. Hei 10-239371. This publication indicates one problem that the non-contact sensor cannot determine the presence of disconnection when used to inspect a circuit wiring having branch portions branched halfway therefrom, and describes an invention intended to solve the above problem by disposing a plurality of non-contact sensors over the ends of the branch portions of the circuit wiring, respectively.

However, the invention of Japanese Patent Laid-Open Publication No. Hei 10-239371 requires non-contact sensors disposed, respectively, over the ends of the branch portions or in the same number as that of the branch portions of the circuit wiring, and thereby the number of non-contact sensors inevitably tends to be increased. This is apt to drive up the cost of the inspection apparatus.

It is therefor a primary object of the present invention to provide an inspection apparatus and inspection method capable of inspecting a circuit wiring having branch portions branched halfway therefrom or a plurality of circuit wirings mixed with such a branched circuit wiring by using a less number of non-contact sensors.

DISCLOSURE OF INVENTION

According to a first aspect of the present invention, there is provided an inspection apparatus for inspecting a branched circuit wiring having three or more ends, said inspection apparatus comprising: supply means for supplying an inspection signal to one end of said branched circuit wiring; one or more non-contact sensors for detecting said inspection signal with being in non-contact with said branched circuit wiring over the remaining ends other than said one end of said branched circuit wiring; and determination means for determining if any disconnection is caused in said branched circuit wiring, based on the inspection signal detected by said one or more non-contact sensors, wherein at least one of said one or more non-contact sensors is arranged to cover two of said remaining ends, and said determination means is operable to determine if any disconnection is caused in said branched circuit wiring by comparing the intensity of said inspection signal with a given threshold, with respect to the inspection signal detected by said at least one non-contact sensor covering said remaining ends.

According to a second aspect of the present invention, there is provided an inspection apparatus for inspecting a circuit wiring including a branched circuit wiring having three or more ends and a single-line circuit wiring having first and second ends, said inspection apparatus comprising: supply means for supplying an inspection signal to one end of said branched circuit wiring or the first-end of said signal-line circuit wiring; one or more non-contact sensors for detecting said inspection signal with being in non-contact with said branched circuit wiring or said single-line circuit wiring over remaining ends other than said one end of said branched circuit wiring or the second-end of said single-line circuit wiring; and determination means for determining if any disconnection is caused in said branched circuit wiring or said single-line circuit wiring, based on the inspection signal detected by said one or more non-contact sensors, wherein at least one of said one or more non-contact sensors is arranged to cover at least one of said remaining ends of said branched circuit wiring and/or said second-end of said single-line circuit wiring.

According to a third aspect of the present invention, there is provided an inspection apparatus for inspecting a circuit wiring including a branched circuit wiring having three or more ends and a single-line circuit wiring having first and second ends, said inspection apparatus comprising: supply means for supplying an inspection signal to one end of said branched circuit wiring or the first-end of said signal-line circuit wiring; one or more non-contact sensors for detecting said inspection signal with being in non-contact with said branched circuit wiring or said single-line circuit wiring over the remaining ends other than said one end of said branched circuit wiring or the second-end of said single-line circuit wiring; and determination means for determining if any disconnection is caused in said branched circuit wiring or said single-line circuit wiring, based on the inspection signal detected by said one or more non-contact sensors, wherein at least one of said one or more non-contact sensors is arranged to cover at least one of said remaining ends of said branched circuit wiring and/or said second-end of said single-line circuit wiring, and said determination means is operable to determine if any disconnection is caused in said branched circuit wiring by comparing the intensity of said inspection signal with a given threshold, with respect to the inspection signal from said at least one of said remaining ends of said branched circuit wiring and/or said second-end of said single-line circuit wiring detected by said at least one non-contact sensor.

According to a fourth aspect of the present invention, there is provided an inspection apparatus for inspecting a circuit wiring including a branched circuit wiring having three or more ends and a single-line circuit wiring having first and second ends, said inspection apparatus comprising: supply means for supplying an inspection signal to one end of said branched circuit wiring or the first-end of said signal-line circuit wiring; one or more non-contact sensors for detecting said inspection signal with being in non-contact with said branched circuit wiring or said single-line circuit wiring over the remaining ends other than said one end of said branched circuit wiring or the second-end of said single-line circuit wiring; a probe for detecting said inspection signal with being in contact with said branched circuit wiring at one of said remaining ends of said branched circuit wiring; and determination means for determining if any disconnection is caused in said branched circuit wiring or said single-line circuit wiring, based on the inspection signal detected by said one or more non-contact sensors or said probe, wherein at least one of said one or more non-contact sensors is arranged to cover at least one of said remaining ends of said branched circuit wiring and/or said second-end of said single-line circuit wiring, and said probe is arranged to cover each of said remaining ends of said branched circuit wiring which is/are not covered by said one or more non-contact sensors.

According to a fifth aspect of the present invention, there is provided an inspection apparatus for inspecting a circuit wiring including a branched circuit wiring having three or more ends and a single-line circuit wiring having first and second ends, said inspection apparatus comprising: supply means for supplying an inspection signal to one end of said branched circuit wiring or the first-end of said signal-line circuit wiring; one or more non-contact sensors for detecting said inspection signal with being in non-contact with said branched circuit wiring or said single-line circuit wiring over the remaining ends other than said one end of said branched circuit wiring or the second-end of said single-line circuit wiring; a probe for detecting said inspection signal with being in contact with said branched circuit wiring at one said remaining ends of said branched circuit wiring; and determination means for determining if any disconnection is caused in said branched circuit wiring or said single-line circuit wiring, based on the inspection signal detected by said one or more non-contact sensors or said probe, wherein at least one of said one or more non-contact sensors is arranged to cover at least one of said remaining ends of said branched circuit wiring and/or said second-end of said single-line circuit wiring, said probe is arranged to cover each of a part or all of said second-ends of said branched circuit wiring which is/are not covered by said one or more non-contact sensors, and said determination means is operable to determine if any disconnection is caused in said branched circuit wiring by comparing the intensity of said inspection signal with a given threshold, with respect to the inspection signal from said at least one of said remaining ends of said branched circuit wiring and/or said second-end of said single-line circuit wiring detected by said at least one non-contact sensor.

According to a sixth aspect of the present invention, there is provided an inspection method for inspecting a branched circuit wiring having three or more ends, said inspection method comprising the steps of: supplying an inspection signal to one end of said branched circuit wiring; disposing one or more non-contact sensors for detecting said inspection signal with being in non-contact with said branched circuit wiring over the remaining ends other than said one end of said branched circuit wiring; and determining if any disconnection is caused in said branched circuit wiring, based on the inspection signal detected by said one or more non-contact sensors, wherein said disposing step includes the step of arranging at least one of said one or more non-contact sensors to cover said remaining ends, and said determining step includes the step of determining if any disconnection is caused in said branched circuit wiring by comparing the intensity of said inspection signal with a given threshold, with respect to the inspection signal detected by said at least one non-contact sensor covering said remaining ends.

According to a seventh aspect of the present invention, there is provided an inspection method for inspecting a circuit wiring including a branched circuit wiring having three or more ends and a single-line circuit wiring having first and second ends, said method comprising the steps of: supplying an inspection signal to one end of said branched circuit wiring or the first-end of said signal-line circuit wiring; disposing one or more non-contact sensors for detecting said inspection signal with being in non-contact with said branched circuit wiring or said single-line circuit wiring over the remaining ends other than said one end of said branched circuit wiring or the second-end of said single-line circuit wiring; and determining if any disconnection is caused in said branched circuit wiring or said single-line circuit wiring, based on the inspection signal detected by said one or more non-contact sensors, wherein said disposing step includes the step of arranging at least one of said one or more non-contact sensors to cover said remaining ends of said branched circuit wiring and/or said second-end of said single-line circuit wiring.

According to an eighth aspect of the present invention, there is provided an inspection method for inspecting a circuit wiring including a branched circuit wiring having three or more ends and a single-line circuit wiring having first and second ends, said inspection method comprising the steps of: supplying an inspection signal to one end of said branched circuit wiring or the first-end of said signal-line circuit wiring; disposing one or more non-contact sensors for detecting said inspection signal with being in non-contact with said branched circuit wiring or said single-line circuit wiring over the remaining ends other than said one end of said branched circuit wiring or the second-end of said single-line circuit wiring; and determining if any disconnection is caused in said branched circuit wiring or said single-line circuit wiring, based on the inspection signal detected by said one or more non-contact sensors, wherein said disposing step includes the step of arranging at least one of said one or more non-contact sensors to cover said remaining ends of said branched circuit wiring and/or said second-end of said single-line circuit wiring, and said determining step includes the step of determining if any disconnection is caused in said branched circuit wiring by comparing the intensity of said inspection signal with a given threshold, with respect to the inspection signal from said at least one of said remaining ends of said branched circuit wiring and/or said second end of said single-line circuit wiring detected by said at least one non-contact sensor.

According to a ninth aspect of the present invention, there is provided an inspection method for inspecting a circuit wiring including a branched circuit wiring having three or more ends and a single-line circuit wiring having first and second ends, said inspection method comprising the steps of: supplying an inspection signal to one end of said branched circuit wiring or the first-end of said signal-line circuit wiring; disposing one or more non-contact sensors for detecting said inspection signal with being in non-contact with said branched circuit wiring or said single-line circuit wiring over the remaining ends other than said one end of said branched circuit wiring or the second-end of said single-line circuit wiring; placing a probe for detecting said inspection signal with being in contact with said branched circuit wiring at one of said remaining ends of said branched circuit wiring; and determining if any disconnection is caused in said branched circuit wiring or said single-line circuit wiring, based on the inspection signal detected by said one or more non-contact sensors or said probe, wherein said disposing step includes the step of arranging at least one of said one or more non-contact sensors to cover one of said remaining ends of said branched circuit wiring and/or said second-end of said single-line circuit wiring, and said placing step includes the step of arranging said probe to cover each of said remaining ends of said branched circuit wiring which is/are not covered by said one or more non-contact sensors.

According to a tenth aspect of the present invention, there is provided an inspection method for inspecting a circuit wiring including a branched circuit wiring having three or more ends and a single-line circuit wiring having first and second ends, said inspection method comprising the steps of: supplying an inspection signal to one end of said branched circuit wiring or the first-end of said signal-line circuit wiring; disposing one or more non-contact sensors for detecting said inspection signal with being in non-contact with said branched circuit wiring or said single-line circuit wiring over the remaining ends other than said one end of said branched circuit wiring or the second-end of said single-line circuit wiring; placing a probe for detecting said inspection signal with being in contact with said branched circuit wiring at one of said remaining ends of said branched circuit wiring; and determining if any disconnection is caused in said branched circuit wiring or said single-line circuit wiring, based on the inspection signal detected by said one or more non-contact sensors or said probe, wherein said disposing step includes the step of arranging at least one of said one or more non-contact sensors to cover said remaining ends of said branched circuit wiring and/or said second-end of said single-line circuit wiring, said placing step includes the steps of arranging said probe to cover each of said remaining ends of said branched circuit wiring which is/are not covered by said one or more non-contact sensors, and said determining step including the step of determining if any disconnection is caused in said branched circuit wiring by comparing the intensity of said inspection signal with a given threshold, with respect to the inspection signal from said remaining ends of said branched circuit wiring and/or said second end of said single-line circuit wiring detected by said at least one non-contact sensor.

BRIEF DESCRIPTION OF DRAWINGS

FIG. 1 (a), (b) is an explanatory diagram of an inspection apparatus using a non-contact sensor, wherein FIG. 1 (b) shows an equivalent circuit of FIG. 1 (a);

FIG. 2 (a), (b), (c) is an explanatory diagram of an inspection apparatus for inspecting a branched circuit wiring by using a non-contact sensor, wherein FIG. 2 (b) shows an equivalent circuit of FIG. 2 (a), and FIG. 2 (b) shows an equivalent circuit of FIG. 2 (a) in the state when the branched circuit wiring has a disconnection at a point 110d;

BEST MODE FOR CARRYING OUT THE INVENTION

Figure 3:
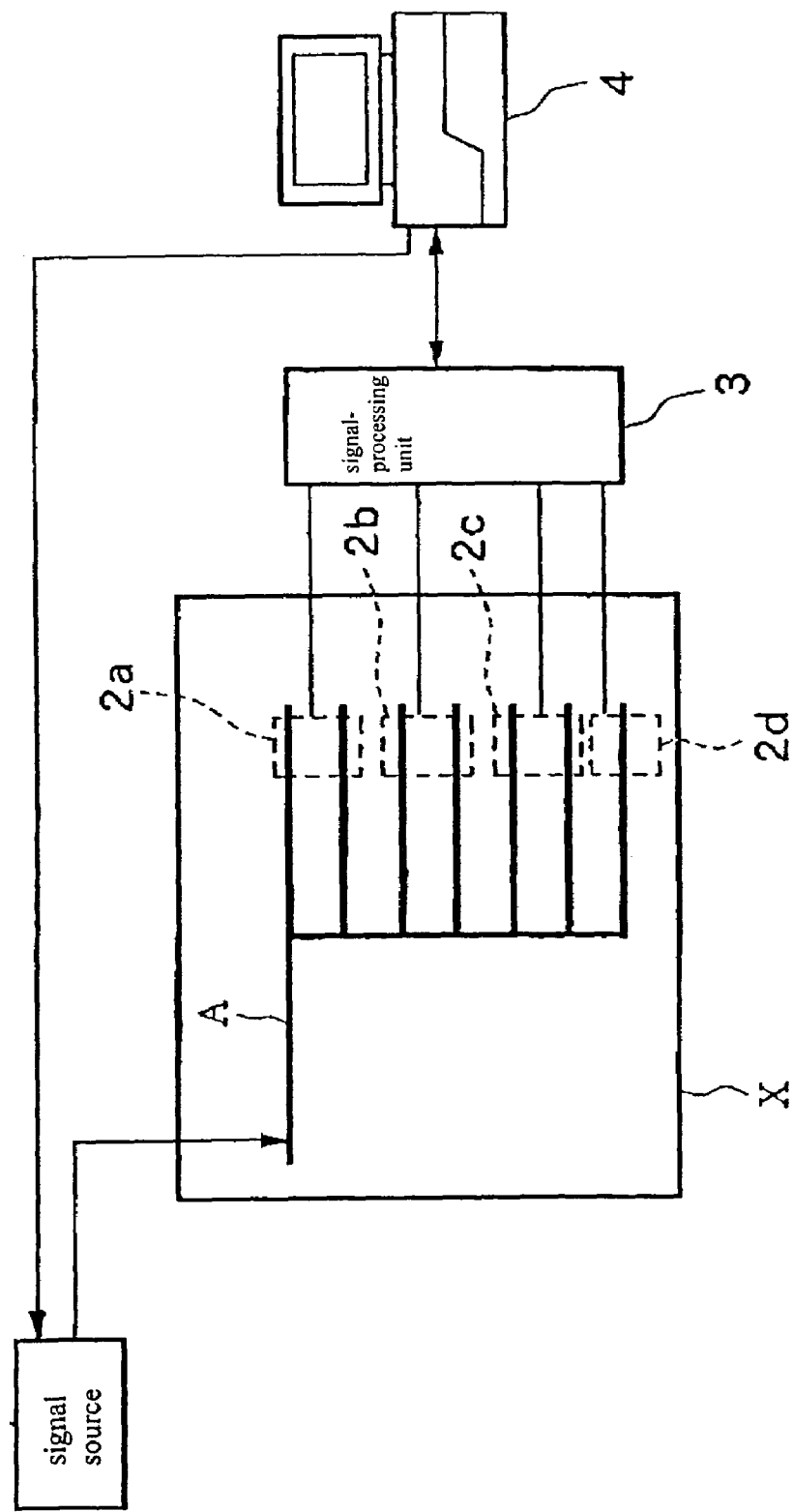
FIG. 3 is a schematic diagram of an inspection apparatus according to one embodiment of the present invention.

A preferred embodiment of the present invention will now be described.

<Principle of Non-Contact Inspection>

FIG. 1 (a) illustrates an inspection apparatus using a non-contact sensor. For inspecting the presence of disconnection in a circuit wiring 100, the inspection apparatus of FIG. 1 (a) comprises a non-contact sensor 101, a signal source 102, and a resistor 103. While this non-contact sensor 101 is an electrode such as a conductive metal plate, another non-contact sensor such as a semiconductor device has also been proposed. The non-contact sensor is disposed in a non-contact manner over one end of the circuit wiring which is an object to be inspected or an inspection target.

The signal source 102 generates an alternating current (AC) signal serving as an inspection signal, and supplies it to the other end of the circuit wiring 100 as the inspection target. As a substitute for the AC signal, any other temporarily varied signal (e.g. a signal having a voltage variation and a frequency ranging from about 1 kHz to about 10 MHz) such as a pulsed signal can be used.

The non-contact sensor 101 and the one end of the circuit wiring 100 are capacitively coupled with each other to define a capacitor. Specifically, an equivalent circuit of FIG. 1 (a) may be represented by FIG. 1 (b). If the circuit wiring 100 has no disconnection, the non-contact sensor 101 can detect a signal caused thereat in response to an inspection signal supplied to the circuit wiring 100 from the signal source 102. Conversely, if the circuit wiring 100 has a disconnection, almost no signal will appear at the non-contact sensor 101. In this manner, the presence of disconnection in the circuit wiring 100 can be determined.

The output signal Vout of the equivalent circuit in FIG. 1 (b) can be approximated by the following formula.

$$Vout = Vin \cdot R/((1/?\cdot C)+R),$$

where Vin is an inspection signal (angular frequency ?), and C is a capacitance between the circuit wiring 100 and the non-contact sensor 101.

<Principle of Non-Contact Inspection for Branched Circuit Wiring>

In FIG. 1, the circuit wiring 100 as an inspection target has been a circuit wiring having two ends or no branch portion (hereinafter referred to as "single-line circuit wiring"). In this section, a non-contact inspection for a circuit wiring as an inspection target which has branch portions branched halfway therefrom (hereinafter referred to as "branched circuit wiring") will be described. It is understood that the branched circuit wiring has three or more ends.

FIG. 2 (a) illustrates an inspection apparatus for inspecting a branched circuit wiring 110 by using a non-contact sensor. Components of the apparatus are the same as those in FIG. 1 (a).

The branched circuit wiring 110 has two branch portions branched halfway therefrom, and thus has three ends. A signal source 102 is operable to supply an inspection signal to a first-end 110c of the branched circuit wiring 110. A non-contact sensor 101 is disposed over a pair of second-ends 110a and 110b of the branched circuit wiring 110.

The non-contact sensor 101 and the pair of second-ends 110a and 110b are capacitively coupled with each other to define two capacitors connected in parallel with each other. Specifically, an equivalent circuit of FIG. 2 (a) may be represented by FIG. 2 (b).

However, when the branched circuit wiring 110 includes a disconnection at a point 110d, an equivalent circuit of FIG. 2 (a) will be represented by FIG. 2 (c). Thus, in this case, the non-contact sensor 102 will also detect a certain signal caused therewith in response to the inspection signal. As a result, if the presence of disconnection is determined simply on the basis of the fact whether the inspection signal is detected by the non-contact sensor 101, the case including the disconnection at the point 110d will be determined as no disconnection.

In the case of FIG. 2 (b), given that each capacitance between the non-contact sensor 101 and the second-end 110a and between the non-contact sensor 101 and the second-end 110b is C, the total capacitance between the non-contact sensor 101 and the circuit wiring 110 is 2C. Thus, the output signal Vout of the equivalent circuit in FIG. 2 (b) can be approximated by the following formula.

$$Vout = Vin \cdot R / ((1/? \cdot 2C) + R)$$

On the other hand, the case of FIG. 2 (c) has the same situation as that in FIG. 1 (b). Thus, comparing the case including no disconnection at the point 110d and the case including a disconnection thereat, the case including a disconnection has lower intensity (voltage herein) of the output signal. Based on this knowledge, the presence of disconnection can be determined by defining as a threshold a specific value between the intensity of the output signal in the normal case and the intensity of the output signal in the case including a disconnection, and comparing this threshold with an output signal in an actual inspection. This allows the presence of disconnection to be determined even if the second-ends of the branched circuit wiring are covered by a single non-contact sensor, instead of covering the second-ends by non-contact sensors, respectively.

However, as the number of the second-ends of the branched circuit wiring to be covered by one non-contact sensor is increased, the difference between the intensity of the output signal in the normal case and the intensity of the output signal in the case including a disconnection tends to get smaller. For example, given that the number of the total ends of the branched circuit wiring is N (the number of branch portions is N−1), the number of the second-ends to be covered by the non-contact sensor is N−1 because one of the total ends is used as the end for entering an inspection signal. Thus, the total capacitance between the non-contact sensor and the branched circuit wiring is equivalent to the total capacitance in the case where capacitors of the number N−1 are connected in parallel with each other.

The output signal Vout in this case can be approximated by the following formula.

$$Vout = Vin \cdot R / ((1/? \cdot (N-1)C) + R)$$

When one of the branch portions of this branched circuit wiring has a disconnection, the output signal Vout can be approximated by the following formula.

$$Vout = Vin \cdot R / ((1/? \cdot (N-2)C) + R)$$

As can be seen from above formulas, as the number of the second-ends of the branched circuit wiring to be covered by one non-contact sensor is increased, the difference between the intensity of the output signal in the normal case and the intensity of the output signal in the case including a disconnection gets smaller, and thereby the range of the threshold to be defined will be limited. Further, considering noise or the like in an actual inspection, it becomes difficult to determine the presence of disconnection accurately.

The inventors of this application have discovered that any accuracy in the inspection of disconnection is not impaired when one non-contact sensor covers the maximum number two of the second-ends of the branched circuit wiring. In this case, the value ranging from about 30% to 40% of the intensity of the output signal in the case where the branched circuit wiring is normal is preferably uses as the threshold.

By arranging one non-contact sensor to cover two of the second-ends of the branched circuit wiring, the number of non-contact sensors can be reduced down to half as compared to the case where the second-ends are covered by non-contact sensors, respectively.

<Embodiments of Inspection Apparatus>

FIG. 3 is a schematic diagram of an inspection apparatus according to one embodiment of the present invention. A circuit board X is provided with a branched circuit wiring A having eight (8) ends, and this branched circuit wiring is an inspection target.

The inspection apparatus comprises a signal source 1 for supplying an inspection signal to a first-end of the branched circuit wiring A, four (4) non-contact sensors 2a to 2d for detecting the inspection signal over seven (7) second-ends of the branched circuit wiring A, a signal-processing unit 3 for subjecting the inspection signal detected by each of the non-contact sensors 2a to 2d to a signal processing or the like, and a computer 4 for governing controls of the entire apparatus and determining the presence of disconnection in the branched circuit wiring A based on the data from the signal-processing unit 3.

The signal source 1 generates an inspection signal under the control of the computer 4, and supplies the inspection signal to the branched circuit wiring A. For example, the inspection signal is supplied from the signal source 1 with keeping a conductive pin in contact with the first-end of the branched circuit wiring A.

Each of the non-contact sensors 2a to 2c is arranged to cover two (2) second-ends of the branched circuit wiring A, and the non-contact sensor 2d is arranged to cover one (1) second-end. That is, one non-contact sensor is arranged to cover the maximum number two of the second-ends.

While it is preferable to maximize the number of the non-contact sensors 2a to 2d each covering two of the second-ends as shown in FIG. 3 to provide minimum number of the non-contact sensors, the non-contact sensors may be arranged in other various modes. For example, at least one of the non-contact sensors 2a to 2d may be arranged to cover two second-ends, and each of the remaining non-contact sensors may be arranged to cover one second-end.

The signal-processing unit 3 includes, for example, an amplifier circuit for amplifying the inspection signal detected by each of the non-contact sensors 2a to 2d, an AD converter for performing analog-to-digital conversion or the like to provide information representing the intensity of the inspection signal detected by each of the non-contact sensors 2a to 2d to the computer 4.

The computer 4 executes a processing for determining if any disconnection is caused in the branched circuit wiring A by comparing the information from the signal-processing unit 3 which represents the intensity of the inspection signal detected by each of the non-contact sensors 2a to 2d, with a predetermined threshold.

In an inspection according to the inspection apparatus having the above structure, each of the non-contact sensors 2a to 2d is first disposed as shown in FIG. 3. Then, the computer 4 controls the signal source 1 to transmit an inspection signal, and thereby the inspection signal is supplied to the branched circuit wiring A.

Then, each of the non-contact sensors 2a to 2d detects the inspection signal, and the signal-processing unit 3 subjects the detected inspection signals to a given processing. The signal-processing unit 3 sends the intensity of the inspection signal detected by each of the non-contact sensors 2a to 2d to the computer 4, and the computer 4 compares the intensity of the inspection signal detected by each of the non-contact sensors 2a to 2d with the given threshold to determine the presence of disconnection in the branched circuit wiring A.

For example, when the intensity of the inspection signal detected by the non-contact sensor 2a is less than the threshold, it will be determined that at least one of two branch portions of the branched circuit wiring A includes a disconnection. Since the non-contact sensor 2d covers only one second-end of the branched circuit wiring A, the presence of disconnection may be determined simply on the basis of the fact whether the inspection signal is detected, and may also be determined by comparing with the threshold as described above.

Figure 4:
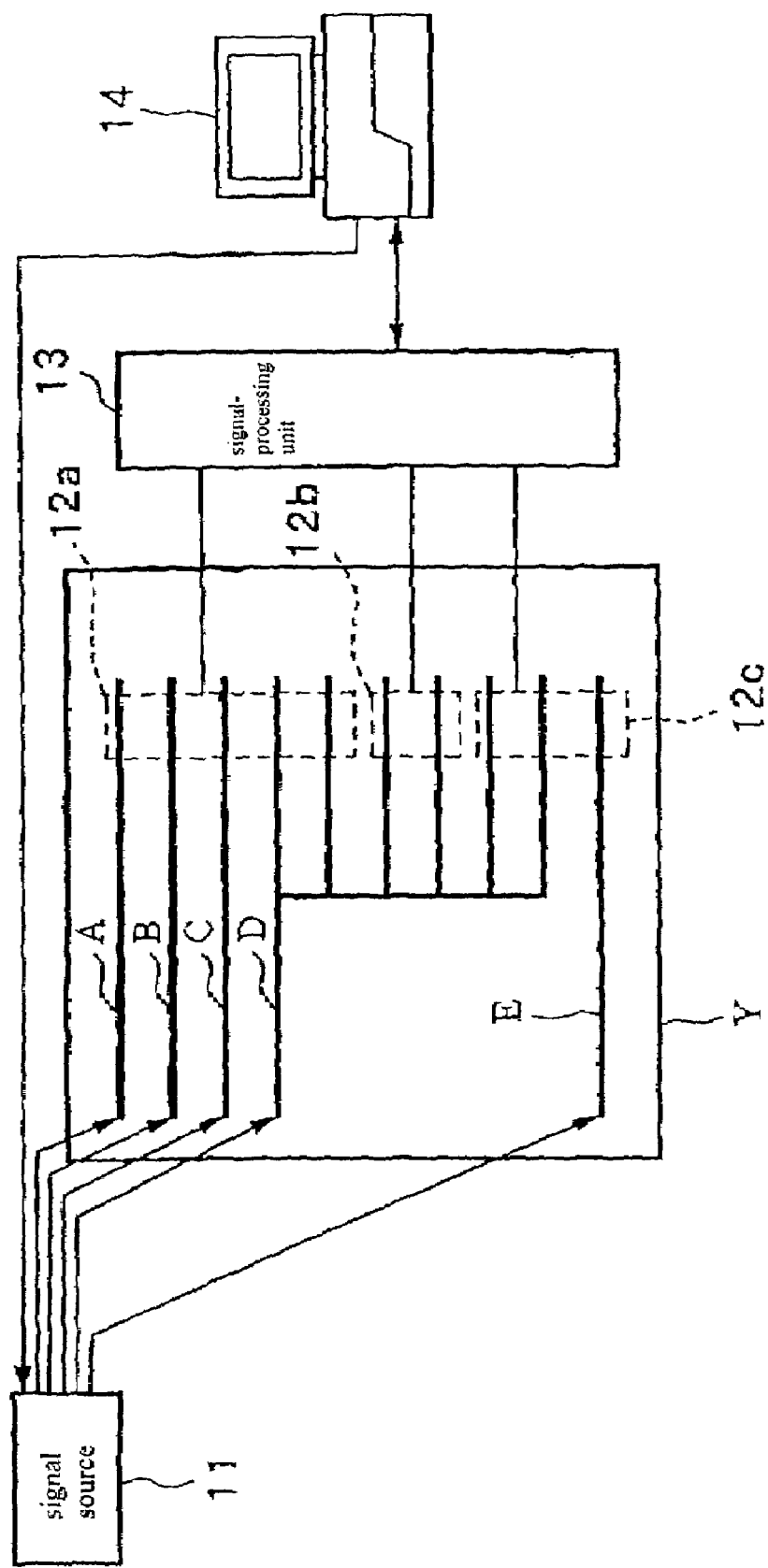
FIG. 4 is a schematic diagram of an inspection apparatus according to another embodiment of the present invention.

FIG. 4 is a schematic diagram of an inspection apparatus according to another embodiment of the present invention.

A circuit board Y is provided with a branched circuit wiring D having seven (7) ends and four (4) single-line circuit wirings A, B, C and E, and these circuit wirings are inspection targets.

The inspection apparatus comprises a signal source 11 for supplying an inspection signal to each of a first-end of the branched circuit wiring D and respective first-ends of the single-line circuit wirings A to C and E, three (3) non-contact sensors 12a to 12c for detecting the inspection signal over six (6) second-ends of the branched circuit wiring D and respective second-ends of the single-line circuit wirings A to C and E, a signal-processing unit 13 for subjecting the inspection signal detected by each of the non-contact sensors 12a to 12c to a signal processing or the like, and a computer 14 for governing controls of the entire apparatus and determining the presence of disconnection in the branched circuit wiring D and the single-line circuit wirings A to C and E, based on the data from the signal-processing unit 13.

The signal source 11, the non-contact sensors 12a to 12c, the signal-processing unit 13, and the computer 14 are similar to the signal source 1, the non-contact sensors 2a to 2d, the signal-processing unit 3, and the computer 4 in FIG. 3, respectively, and thereby differences therebetween will be particularly described below.

The signal source 11 is intended to supply an inspection signal sequentially to respective second-ends of the circuit wirings A to E, and the supply timing is controlled by the computer 14.

Each of the non-contact sensors 12a to 12c may be arranged to cover maximum number two of the second-ends of the branched circuit wiring D and one or more of the second ends of the single-line circuit wirings A to C and E. Because, in mutually separated circuit wirings, the inspection signal can be detected separately from each of the second-ends of the circuit wirings by supplying the inspection signal separately to each of the first-ends thereof, and thereby such a detection can be sufficiently achieved by one non-contact sensor.

More specifically, for example, in the single-line circuit wirings A to C, the presence of disconnection in each of the single-line circuit wirings A to C can be separately determined by sequentially supplying the inspection signal at a given timing, and checking the presence of the inspection signal detected by the non-contact sensor 12a in time with the above timing.

As shown in FIG. 4, in addition to the single-line circuit wirings A to C, the inspection signal in one of the branch portions of the branched circuit wiring D can be detected only by the non-contact sensor 12a. Further, the inspection signal in two of the branch portions of the branched circuit wiring D can be detected in the same way, and the presence of disconnection can be determined by comparing the detected inspection signal with a given threshold as described in the section <Principle of Non-Contact Inspection for Branched Circuit Wiring>.

In FIG. 4, the non-contact sensor 12a is arranged to cover all of the second-ends of the single-line circuit wirings A to C and two of the second-ends of the branched circuit wiring D. The non-contact sensor 12c is arranged to cover the second-end of the single-line circuit wiring E and two of the second-ends of the branched circuit wiring D.

Further, the non-contact sensor 12b is arranged to cover the remaining two second-ends of the branched circuit wiring D.

In an inspection according to the inspection apparatus having the above structure, each of the non-contact sensors 12a to 12c is first disposed as shown in FIG. 4. Then, the computer 14 controls the signal source 11 to transmit an inspection signal. In this process, the inspection signal is supplied sequentially to each of the circuit wirings A to E, for example, in the order of the single-line circuit wiring A ? B ? C ? the branched circuit wiring D ? the single-line circuit wiring E.

Then, each of the non-contact sensors 12a to 12c detects the inspection signal, and the signal-processing unit 13 subjects the detected inspection signals to a given processing. The signal-processing unit 13 sends information about the inspection signal detected by each of the non-contact sensors 12a to 12d to the computer 14.

The computer 14 will then determine the presence of disconnection in accordance with the timing of supplying the inspection signal from the signal source 11 to each of the circuit wirings A to E, and the timing of detecting the inspection signal by each of the non-contact sensors 12a to 12c.

In this process, the presence of disconnection in each of the single-line circuit wirings A to C and E can be determined only by checking on the basis of the fact whether a certain inspection signal is detected at the above timing by each of the non-contact sensors 12a and 12c. That is, when a certain inspection signal is detected, it can be determined that no disconnection is included. Further, when no inspection signal is detected, it can be determined that a certain disconnection is caused.

On the other hand, since the presence of disconnection in the branched circuit wiring D is determined by comparing the intensity of the inspection signal detected by each of the non-contact sensors 12a to 12c with the given threshold, because it cannot be accurately determined on the basis of the fact whether a certain inspection signal is detected.

In the inspection apparatus of FIG. 4, the non-contact sensors 12a to 12c may be arranged in other various modes. While each of the non-contact sensors 12a and 12c is arranged to cover two second-ends of the branched circuit wiring D in the embodiment of FIG. 4, each of them may be arranged to cover, for example, one second-end. In this case, the presence of disconnection can be determined only by checking on the basis of the fact whether a certain inspection signal is detected by each of these sensors, and it is not essential to compare with the threshold.

Further, while the one non-contact sensor 12a is arranged to cover all of the second-ends of the single-line circuit wirings A to C and two second-ends of the branched circuit wiring D in the embodiment of FIG. 4, one non-contact sensor may be arranged to cover the second-ends of the single-line circuit wirings A and B, and another non-contact sensor may be arranged to cover the second-end of the single-line circuit wiring C and two second-ends of the branched circuit wiring D.

Thus, according to the inspection apparatus of FIG. 4, when a single-line circuit wiring and a branched circuit wiring are mixedly provided on a circuit board, the number of non-contact sensors can be reduced by arranging one non-contact sensor to cover both the second-end of the single-line circuit wiring and the second-end of the branched circuit wiring.

Figure 5:
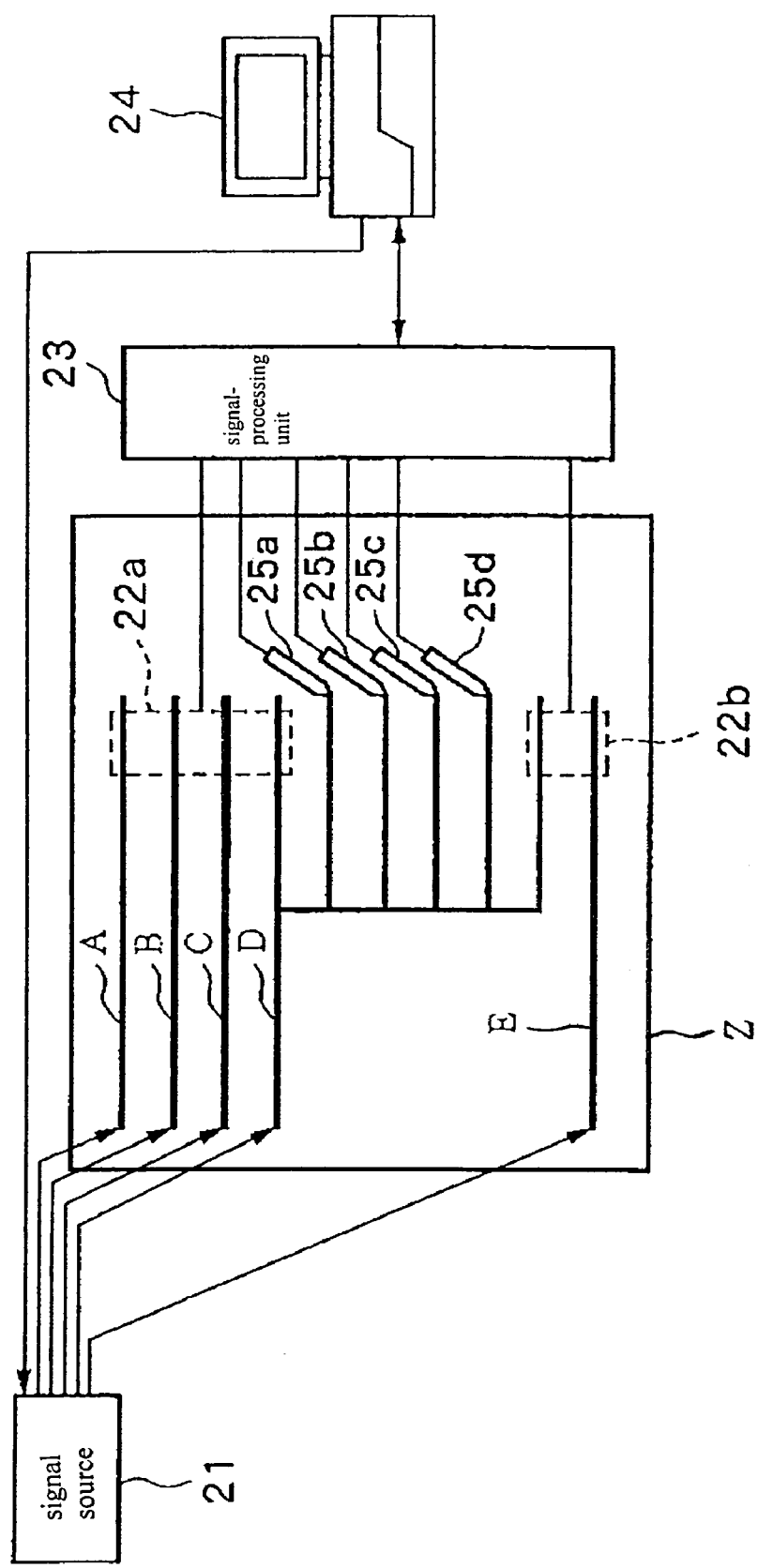
FIG. 5 is a schematic diagram of an inspection apparatus according to still another embodiment of the present invention.

FIG. 5 is a schematic diagram of an inspection apparatus according to still another embodiment of the present invention.

A circuit board Z is provided with a branched circuit wiring D having seven (7) ends and four (4) single-line circuit wirings A, B, C and E as with the circuit board Y of FIG. 4, and these circuit wirings are inspection targets.

The inspection apparatus comprises a signal source 21 for supplying an inspection signal to each of a first-end of the branched circuit wiring D and respective first-ends of the single-line circuit wirings A to C and E, two (2) non-contact sensors 22a and 22b for detecting the inspection signal over two (2) second-ends of the branched circuit wiring D and respective second-ends of the single-line circuit wirings A to C and E, probes 25a to 25d for detecting the inspection signal at four (4) second-ends of the branched circuit wiring D, a signal-processing unit 23 for subjecting the inspection signal detected by each of the non-contact sensors 22a and 22b and the probes 25a to 25d to a signal processing or the like, and a computer 24 for governing controls of the entire apparatus and determining the presence of disconnection in the branched circuit wiring D and the single-line circuit wirings A to C and E, based on the data from the signal-processing unit 23.

The signal source 21, the non-contact sensors 22a and 22b, the signal-processing unit 23, and the computer 24 are similar to the signal source 11, the non-contact sensors 12a to 12c, the signal-processing unit 13, and the computer 14 in FIG. 4, respectively, and thereby differences therebetween will be particularly described below.

Each of the probes 25a to 25d is composed, for example, of a pin having conductivity, and intended to detect the inspection signal with being in contact with the corresponding second end of the branched circuit wiring D. The inspection apparatus of FIG. 5 employs the probes 25a to 25d for a substitute of the non-contact sensor 12b in the inspection apparatus of FIG. 4. Employing the probe can provide lower-cost inspection apparatus, because the non-contact sensor is generally more expensive than the probe even though there is some individual difference. However, the non-contact sensor has an advantage of allowing a plurality of single-line circuit wirings to be inspected by one non-contact sensor as described above, and thus the inspection apparatus of FIG. 5 has been constructed by mixing these two.

In FIG. 5, the non-contact sensor 22a is arranged to cover all of the second-ends of the single-line circuit wirings A to C and one of the second-ends of the branched circuit wiring D. The non-contact sensor 22b is arranged to cover the second-end of the single-line circuit wiring E and one of the second-ends of the branched circuit wiring D. Further, the probes 25a to 25d are arranged to cover the remaining four second-ends of the branched circuit wiring D, respectively.

In an inspection according to the inspection apparatus having the above structure, each of the non-contact sensors 22a and 22b is first disposed as shown in FIG. 5, and the probes 25a to 25d are placed on the remaining second-ends of the branched circuit wiring D, respectively.

Subsequent processes are the same as those in the inspection apparatus of FIG. 4. That is, the computer 24 controls the signal source 21 to transmit an inspection signal. In this process, the inspection signal is supplied sequentially to each of the circuit wirings A to E, for example, in the order of the single-line circuit wiring A ? B ? C ? the branched circuit wiring D ? the single-line circuit wiring E.

Then, each of the non-contact sensors 22a and 22b and the probes 25a to 25d detects the inspection signal, and the signal-processing unit 23 subjects the detected inspection signals to a given processing. The signal-processing unit 23 sends information about the inspection signal detected by each of the non-contact sensors 22a and 22b and the probes 25a to 25d to the computer 24.

The computer 24 will then determine the presence of disconnection in accordance with the timing of supplying the inspection signal from the signal source 21 to each of the circuit wirings A to E, and the timing of detecting the inspection signal by each of the non-contact sensors 22a and 22b and the probes 25a to 25d.

In this process, the presence of disconnection in each of the circuit wirings A to E can be determined only by checking on the basis of the fact whether a certain inspection signal is detected at the above timing by each of the non-contact sensors 22a and 22b and the probes 25a to 25d. That is, when a certain inspection signal is detected, it can be determined that no disconnection is included. Further, when no inspection signal is detected, it can be determined that a certain disconnection is caused. Because each of the non-contact sensors 22a and 22b in FIG. 5 is arranged to cover one second-end of the branched circuit wiring D, instead of covering two second-ends thereof.

In the inspection apparatus of FIG. 5, the non-contact sensors 22a and 22b and the probes 25a to 25d may be arranged in other various modes.

While each of the non-contact sensors 22a and 22b is arranged to cover one second-end of the branched circuit wiring D in the embodiment of FIG. 5, each of them may be arranged to cover, for example, two second-ends. In this case, the presence of disconnection will be determined by comparing the intensity of the inspection signal detected by these sensors with the given threshold.

Further, in the embodiment of FIG. 5, each of the non-contact sensors 22a and 22b is arranged to cover one or more second-ends of the single-line circuit wirings A to C and one second-end of the branched circuit wiring D, and the probes 25a to 25d is arranged to cover all of the remaining second-ends of the branched circuit wiring D. However, one or more probes may be arranged to cover a part of the remaining second-ends of the branched circuit wiring D, and an additional non-contact sensor may be arranged to cover the thereafter remaining second-ends thereof. In this case, the additional non-contact sensor may cover the maximum number two of the second-ends.

Thus, according to the inspection apparatus of FIG. 5, when a single-line circuit wiring and a branched circuit wiring are mixedly provided on a circuit board, the number of non-contact sensors can be reduced by arranging one non-contact sensor to cover both the second-end of the single-line circuit wiring and the second-end of the branched circuit wiring. In addition, by arranging a probe to cover the remaining end of the branched circuit wiring, the number of non-contact sensors can be further reduced.

While the present invention has been described in conjunction with preferred embodiment thereof, it is to be understood that the present invention is not limited to such embodiments, and particularly that the non-contact sensor(s) and/or the probe(s) can be arranged in various modes without departing the spirit and scope of the present invention.

INDUSTRIAL APPLICABILITY

As described above, according to the present invention, a branched circuit wiring having branch portions branched halfway therefrom or a circuit wiring mixedly including such a branched circuit wiring can be inspected by using a less number of non-contact sensors.

What is claimed is:

1. An inspection apparatus for inspecting a branched circuit wiring formed on a surface of a circuit board, the branched circuit wiring comprising a first branch and at least two second branches, each of the second branches being connected to the first branch, wherein the second branches are formed on the same surface, wherein the branched circuit wiring has at least three ends, the inspection apparatus, comprising:
  a supply means for supplying an inspection signal to the first branch;
  a non-contact sensor located over two of the second branches, the non-contact sensor detecting the inspection signal in a non-contact manner with the branched circuit wiring; and
  a determination means for determining if any disconnection is caused in the branched circuit wiring, based on the inspection signal detected by the non-contact sensor over the second branches, by comparing the intensity of the inspection signal with a given threshold.

2. An inspection apparatus for inspecting a branched circuit wiring formed on a surface of a circuit board comprising a first branch and at least two second branches, each of the second branches being connected to the first branch, and at least one single-line circuit wiring, wherein the second branches and the single-line circuit wiring are formed on the same surface, wherein the branched circuit wiring has at least three ends, the inspection apparatus comprising:
  a supply means for supplying an inspection signal to the first branch or the single-line circuit wiring;
  a non-contact sensor for detecting the inspection signal in a non-contact manner with the second branches and the single-line circuit wiring; and
  a determination means for determining if any disconnection is caused in the branched circuit wiring or the single-line circuit wiring,
  wherein the non-contact sensor is located over two of the second branches and the single-line circuit wiring, and
  wherein the determination means determines if any disconnection is caused in the branched circuit wiring or the single-line circuit wiring by comparing the intensity of the inspection signal detected by the non-contact sensor with a given threshold.

3. An inspection apparatus as defined in claim 2, wherein the non-contact sensor is located over two of the second branches.

4. An inspection apparatus as defined in claim 2, wherein the supply means alternatively supplies the inspection signal to one of the first branch and the single-line circuit wiring.

5. An inspection apparatus in combination with an inspected circuit board, comprising:
  an inspected circuit board having a branched circuit wiring formed on a surface of the circuit board, the branched circuit wiring comprising:
    a first branch; and
    at least two second branches, each of the second branches being connected to the first branch, wherein the second branches are formed on the same surface, wherein the branched circuit wiring has at least three ends; and
  an inspection apparatus, comprising:
    a supply means for supplying an inspection signal to the first branch;
    a non-contact sensor for detecting the inspection signal in a non-contact manner with the branched circuit wiring, covering two of the second branches; and
    a determination means for determining if any disconnection is caused in the branched circuit wiring,
  wherein the determination means determines if any disconnection is caused by comparing the intensity of the inspection signal detected by the non-contact sensor with a given threshold based on the inspection signal.

6. An inspection apparatus in combination with an inspected circuit board, comprising:
  an inspected circuit board having a surface, comprising:
    a branched circuit wiring, comprising a first branch and at least two second branches, each of the second branches being connected to the first branch, wherein the branched circuit wiring has at least three ends; and
    at least one single-line circuit wiring, wherein the second branches and the single-line circuit wiring are formed on the same surface; and
  an inspection apparatus comprising:
    a supply means for supplying an inspection signal to the branched circuit wiring or the single-line circuit wiring;
    a non-contact sensor for detecting the inspection signal in a non-contact manner with the branched circuit wiring and the single-line circuit wiring, covering two of the second branches and the single-line circuit wiring; and
    a determination means for determining if any disconnection is caused in the branched circuit wiring or the single-line circuit wiring,
  wherein the determination means determines if any disconnection is caused in the branched circuit wiring by comparing the intensity of the inspection signal detected by the non-contact sensor with a given threshold.

7. An inspection apparatus as defined in claim 6, wherein the non-contact sensor is located over two of the second branches.

8. An inspection apparatus as defined in claim 6, wherein the supply means alternatively supplies the inspection signal to one of the second branches and the signal-line circuit wiring.

* * * * *